(12) United States Patent
Sen et al.

(10) Patent No.: US 7,642,865 B2
(45) Date of Patent: Jan. 5, 2010

(54) SYSTEM AND METHOD FOR MULTIPLE-PHASE CLOCK GENERATION

(75) Inventors: Tanmoy Sen, New Delhi (IN); Anand Kumar, Noida (IN); Deependra Kumar Jain, Jabalpur District (IN)

(73) Assignee: STMicroelectronics Pvt. Ltd., Greater Noida, UP (IN)

( * ) Notice: Subject to any disclaimer, the term of this patent is extended or adjusted under 35 U.S.C. 154(b) by 98 days.

(21) Appl. No.: 11/616,742

(22) Filed: Dec. 27, 2006

(65) Prior Publication Data

US 2007/0200641 A1   Aug. 30, 2007

(30) Foreign Application Priority Data

Dec. 30, 2005   (IN)   .................. 3550/DEL/2005

(51) Int. Cl.
*H03B 27/00*   (2006.01)
(52) U.S. Cl. .................. 331/45; 331/DIG. 2; 331/57
(58) Field of Classification Search .............. 331/45, 331/57, DIG. 2
See application file for complete search history.

(56) References Cited

U.S. PATENT DOCUMENTS

| 3,795,800 | A | 3/1974 | Nimmo |
| 4,993,051 | A | 2/1991 | Feldbrugge |
| 6,380,774 | B2 | 4/2002 | Saeki |
| 6,617,893 | B1* | 9/2003 | Born et al. ................... 327/115 |
| 6,809,567 | B1 | 10/2004 | Kim et al. |
| 7,362,187 | B1* | 4/2008 | Lai et al. ....................... 331/45 |
| 7,414,484 | B2* | 8/2008 | Kwasniewski et al. ......... 331/45 |
| 2002/0084816 | A1* | 7/2002 | Harris ......................... 327/159 |

OTHER PUBLICATIONS

Overfield; "Error Correction in Johnson counters"; New Electronics; Design Focus; May 27, 1980; p. 38; vol. 13(11).

* cited by examiner

*Primary Examiner*—Joseph Chang
(74) *Attorney, Agent, or Firm*—Hogan & Hartson LLP

(57) ABSTRACT

A multiple phase clock circuit includes a multiple stage voltage controlled oscillator (VCO) and multiple clock dividers. The VCO is operative at a frequency 'N' times higher than the required output frequency and generates 'M' equally spaced outputs having different phases but same frequency which are sent to multiple clock dividers. A modified Johnson counter is used as a clock divider. Each counter divides the frequency of the clock signal by N. As a result, each of the M outputs of the VCO are divided into N outputs, thereby making a total of 'M×N' equally spaced outputs. These output clock pulses have same frequency but different phases. A sequential logic is provided within the device for enabling the Johnson counters as soon as the VCO starts giving output, thus maintaining the sequence of the output of the Johnson counters.

10 Claims, 6 Drawing Sheets

SYSTEM AND METHOD FOR MULTIPLE-PHASE CLOCK GENERATION

RELATED APPLICATIONS

The present application claims priority of India Patent Application No. 3550/Del/2005, first filed Dec. 30, 2005 as a provisional application, for which a complete specification was filed Dec. 22, 2006, said applications being incorporated herein in their entireties by this reference.

FIELD OF INVENTION

The present invention relates to the field of clock generation technology and more particularly to a system and method for multiple-phase clock generation.

BACKGROUND OF THE INVENTION

Clock signals are used by complex sequential digital circuits to synchronize the operation of the circuit and perform its operations in an orderly manner. These signals are periodical signals with known timing. The timing provides the reference at which the state of the digital system is changed. The use of clock signals allows coherent functioning of the entire circuit design. The clock signal may be distributed over the circuit design and used by all storage elements. This is known as single phase clocking strategy. In multiple phase clocking strategy, timing relationships are used between clock phases to relax the timing requirements. Multiple clocks of same frequency separated by a fixed phase difference are generated. This makes the circuit to operate at a frequency N times lower than actual frequency, where N is the number of phases of clock used.

Many techniques have been employed to generate multiphase clock signals. One possible technique is to make a ring oscillator and tap its nodes. A voltage controlled or current controlled differential ring oscillator having multiple stages of delayed differential inverted amplifiers connected in a ring form is used to generate multiphase clock signals having the same phase difference.

However, this technique faces a number of shortcomings. The layout of the circuit has to be made absolutely matched. Even the parasitic capacitances seen at the intermediate node of the ring have to be same. Difference in parasitic capacitances may result in asymmetric waveforms. Moreover, if large number of phases is required, the number of stages needed also increases. When these stages are attempted to match, the parasitic loading in the intermediate nodes increases. This in turn limits the frequency of operation of the oscillator.

Another technique used for generation of multiple phase clock pulses is that of interpolation between two phases (as disclosed by U.S. Pat. No. 6,380,774 to Saeki). A clock control circuit is made comprising of a frequency multiplying interpolator and at least one phase adjusting interpolator as its basic components. The frequency multiplying interpolator includes a plurality of circuits each of which is for outputting signal obtained by internally dividing a phase difference between two signals, for generating a plurality of frequency multiplied clocks, which have phases that differ from one another. Two of such frequency multiplied clocks are input to the phase adjusting interpolator. Multiphase clock signals are then obtained by internally dividing phase difference between these two frequency multiplied clocks.

However, this technique generates phase errors in the interpolated clocks. Any mismatch during the entire process of interpolation may lead to large deviations. If the clock phases have short rise/fall times then the interpolated value deviates from ideal value since the input clocks to the interpolator are in non linear region. If the clock phases have bigger rise/fall times, effects of offsets and noise in the circuit increase.

U.S. Pat. No. 6,809,567 B1 to Kim et al discloses yet another technique for multiple phase clock generation. The technique utilizes a multiple-stage voltage controlled oscillator for generating a plurality of clock phases. These clock phases are then fed to a clock divider circuit. The clock divider circuit includes a modified Johnson counter which generates a plurality of clock phases from each output of voltage controlled oscillator. Each output of the Johnson counter is connected to a separate modified shift register. These shift registers contain D-type flip flops and each flip flop provides a separate clock phase output.

The above mentioned technique is an efficient method of generating multiple phase clock signals. However, the circuitry required for implementation of disclosed technique is very large and extensive.

Therefore there is a need for a system and method that generates multiple clocks of same frequency separated by a fixed and exact phase difference having symmetric waveforms and at the same time which can be implemented using minimal and simple circuitry.

SUMMARY OF THE INVENTION

An object of the present invention is to provide a system and method for generating symmetric clock pulses of same frequency separated by a fixed and accurate phase difference which can be implemented using simple circuitry.

The above mentioned object of the present invention is achieved by providing a circuit for multiple phase clock generation which consists of a multiple stage voltage controlled oscillator (VCO) and a clock divider circuit. The VCO is made to operate at frequency 'N' times higher than the required output frequency. It generates 'M' equally spaced outputs having different phases but same frequency which are sent to the clock divider circuit. The clock divider circuit comprises a plurality of modified divide-by-N Johnson counters, each counter corresponding to one output of the voltage controlled oscillator. Each counter divides the frequency of the clock signal by N. As a result, N output are generated from each of the M outputs of the VCO, thereby making a total of 'M×N' equally spaced outputs. These output clock pulses have same frequency but different phases. A sequential logic is provided within the device for enabling the Johnson counters as soon as the VCO starts giving output. This maintains the sequence of the output of the Johnson counters. The values of M and N can be chosen by the designer according to the phase accuracy required and current consumption allowed.

To achieve the aforementioned objects the present invention provides a circuit for generating multiple phase clock signals comprising a voltage controlled oscillator (VCO) having a plurality of VCO cells cascaded in a ring structure to generate a plurality of VCO output clock signals and a clock divider circuit for dividing and phase shifting the VCO output clock signals. The clock divider circuit includes a counter corresponding to each of the VCO output clock signals for dividing said VCO output clock signals by a specific number to generate a plurality of phase shifted output clock signals having same frequency, and a sequential logic for enabling said counters, such that each of said counter starts from a same state and generates a plurality of phase shifted output clock signals in the same order in which said counters receive the VCO output clock signals.

Further the invention provides a method for generating multiple phase clock signals which includes the steps of generating at least one VCO output clock through a VCO, receiving the at least one VCO output clock through a clock divider circuit, dividing the at least one VCO output clock by a specific number to generate a plurality of phase shifted output clocks having a same frequency through at least one counter, said counter corresponding to each of the at least one VCO output clock, generating an external and internal signal after the VCO starts giving output through a signal module, and enabling the at least one counter through a sequential logic, such that said counter starts from a state and generates the plurality of phase shifted output clocks in an order in which the at least one VCO output clock is received.

BRIEF DESCRIPTION OF THE DRAWINGS

The present invention is described with the help of accompanying drawings.

DETAILED DESCRIPTION OF THE INVENTION

Figure 1:
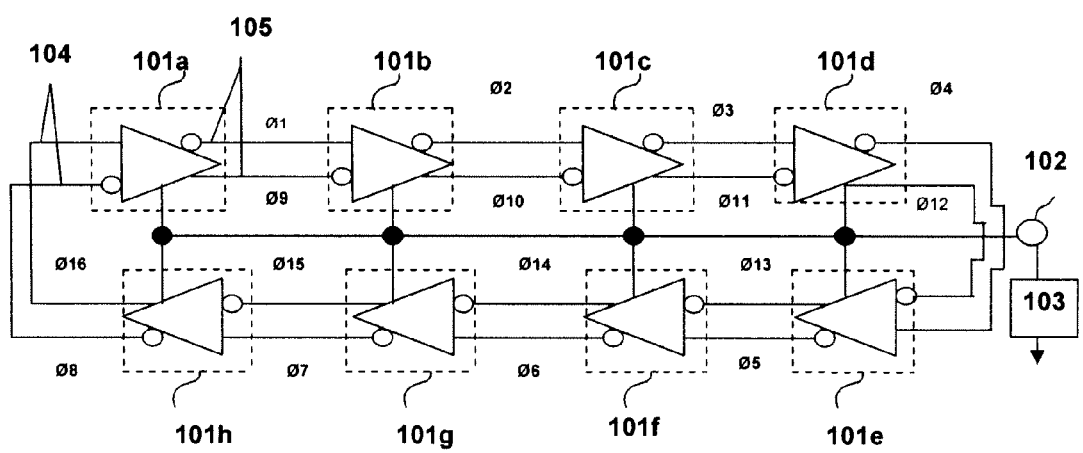
FIG. 1 shows a voltage controlled differential ring oscillator used for generating multiphase clock signals.

FIG. 1 shows a voltage controlled differential ring oscillator used for generating multiphase clock signals. It includes N stages (in this embodiment 8 stages) of delay differential inverting amplification circuits (101a, 101b, ... 101h) connected in the form of a ring and control terminal (102) for controlling the delay time in the delay differential inverting amplification circuit of each stage. Connected to the control terminal is a control voltage source (103). The delay differential inverting amplification circuit of each stage has a differential input terminal pair (104) and a differential output terminal pair (105) where each pair consists of an inverting and a non inverting terminal. The differential output terminal pair (105) of an amplification circuit is connected to the differential input terminal (104) of the next amplification circuit in such a way that a noninverting output terminal of the previous stage is connected to an inverting terminal of the subsequent stage and vice versa. However, the non inverting output terminal of a delaying differential inverting amplifier 101h is connected to a non inverting input terminal of a delaying differential inverting amplifier 101a. With this arrangement, a signal phase is inverted after passing through the ring once. Each delay differential inverting amplifier amplifies the difference between the signals applied to the inverting and the non inverting input terminal. The delay time of each of the delay differential inverting amplifier is controlled by a control voltage applied to control terminal (102) by means of a control voltage source (103).

The 8-stage differential ring oscillator as described above, produces output clock signals Ø1-Ø16 from respective differential output terminal pairs (105). However, this technique of generating multiple phase clock pulses faces a number of shortcomings. For proper functioning of the system, the layout of the circuit must be made absolutely matched. Even the parasitic capacitances seen at the intermediate node of the ring should be same. Difference in parasitic capacitances may result in asymmetric waveforms. Moreover, if large number of phases is required, the number of stages also increases. When these stages are attempted to match, the parasitic loading in the intermediate nodes increases. This in turn limits the frequency of operation of the oscillator.

Figure 2:
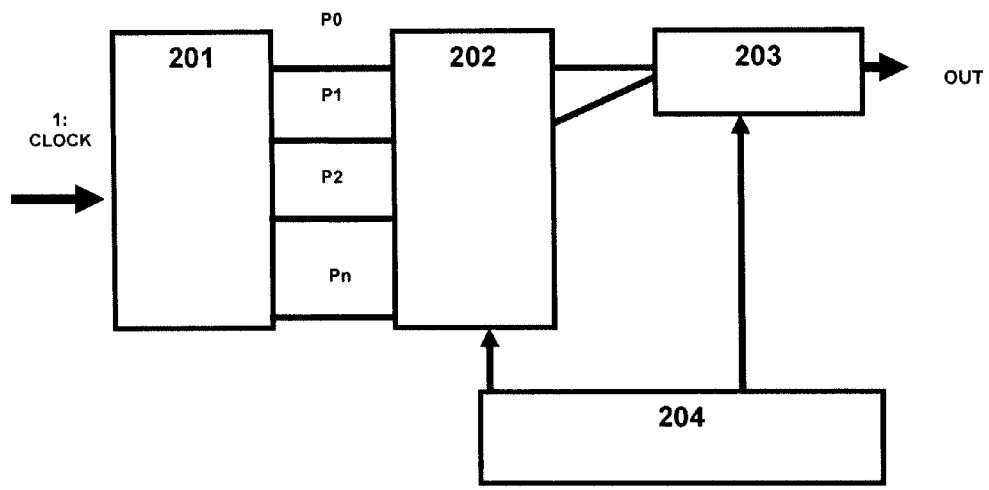
FIG. 2 shows a block diagram illustrating another known circuit used for generating multiphase clock signals.

FIG. 2 shows a block diagram illustrating another technique used for generating multiphase clock signals. As shown in the figure, the circuit comprises of: a frequency multiplying interpolator (201), a rotary switch (202), a phase adjusting interpolator (203) and a control circuit (204). The frequency multiplying interpolator (201) includes a plurality of circuits each for outputting a signal obtained by internally dividing a phase difference between two signals. It generates and outputs multiphase clocks (P0 to Pn) obtained by frequency multiplying an input clock signal (1). These multiphase clocks then act as input to the rotary switch (202). The rotary switch (202) in turn outputs two mutually adjacent ones of the multiphase clocks. These two clocks are input to the phase adjusting interpolator (203) which is also known as fine adjusting interpolator. The phase adjusting interpolator (203) outputs a signal OUT by internally dividing the phase difference between these two inputs. The control circuit (204) controls the switching of the switch (202) and varies the internal division ratio of the interpolator (203).

In the above-mentioned technique, the accuracy of the interpolated phase depends on the process of interpolation. Any mismatch during the entire process of interpolation leads to large deviations. If the clock phases have short rise/fall times then the interpolated value deviates from ideal value since the input clocks to the interpolator are in non linear region. If the clock phases have bigger rise/fall times, effects of offsets and noise in the circuit increase. This again produces deviations from the ideal behavior.

Figure 3:
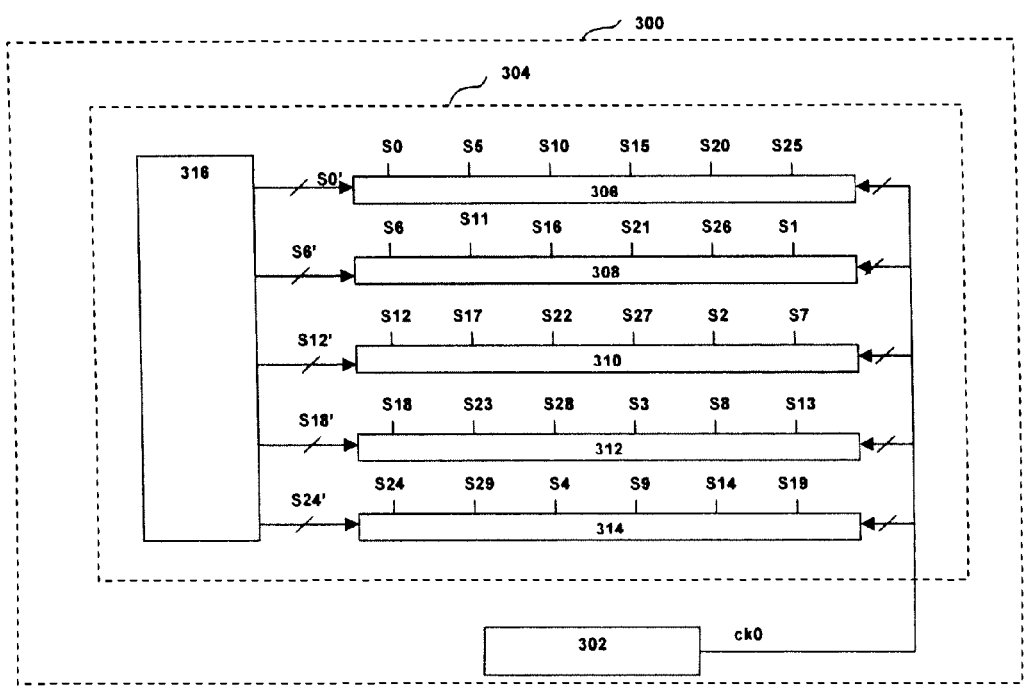
FIG. 3 shows a block diagram illustrating yet another known multiphase clock generator.

FIG. 3 shows a block diagram illustrating another known multiphase clock generator. A particular embodiment of multiphase clock generator has been shown in FIG. 3.The multiphase clock generator (300) includes a multiphase VCO (302) having 6 outputs (ck0 to ck5). These 6 outputs are fed into a synchronous clock divider circuit (304). The clock divider circuit comprises of a modified counter circuit (316) and 5 modified shift registers (306, 308, 310, 312 and 314). In an embodiment of the present invention the modified counter circuit is a modified Johnson Counter. Other types of counters can also be used in different embodiments of the present invention. The modified counter circuit (316) will hereinafter be described as a modified Johnson Counter (316). Each of the six outputs ck0-ck5 is connected to these five modified shift registers. Each of the five modified shift registers (306)-(314) also receive an input signal S0', S6', S12', S18' and S24' respectively from the modified Johnson counter (316). All the modified shift registers are comprised of positive edge triggered D-type flip flops. Modified shift register (306) for example has D type flip flops (320), (322), (324), (326), (328) and (330) (not shown in FIG. 3). Modified shift register (306) receives clock pulse S0' from the Johnson counter in a D input of first D-type flip flop (320). The outputs of all the D flip flops are connected to inputs of next D type flip flop. The D type flip flops (320), (322), (324), (326), (328) and (330) are clocked by clock phases ck0, ck5, ck4, ck3, ck2 and ck1 and provide outputs S0, S5, S10, S15, S2 and S25 respectively. Similarly, all the five modified shift registers comprising six flip flops each generate 30 output clocks of different phases. These 30 output clocks are shown as S0-S29 in FIG. 3.

The above mentioned technique is an efficient method of generating multiple phase clock signals. However, the circuitry required for implementation of this technique includes large number of components including a modified Johnson counter, storage devices such as modified shift registers and voltage controlled oscillator. This results in making the complete circuitry large and complex.

Figure 4:
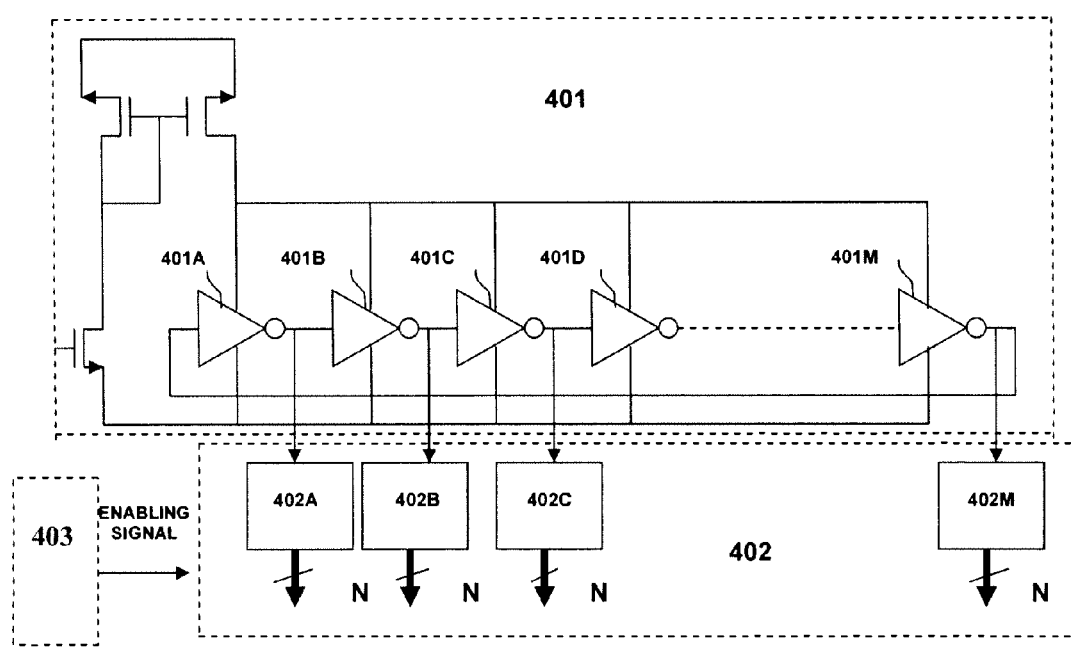
FIG. 4 shows a block diagram illustrating the structure of one embodiment of the present invention.

To overcome the shortcomings of the prior art, the present invention discloses a novel method for generating multiple clocks. The basic circuit required for implementation of the proposed method is shown in FIG. 4. The circuit comprises of a multiple stage voltage controlled oscillator (VCO) (401) and a clock divider circuit (402) having plurality of counters. These counters are enabled by means of an enabling signal from a sequential logic (403).

VCO (401) comprises M VCO cells (401A, 401B . . . 401M) cascaded in a ring structure. The VCO is made to operate at a frequency which is 'N' times that of the required output frequency. It generates 'M' equally spaced VCO output clocks having different phases. Each of these outputs is sent to a clock divider circuit (402). The clock divider circuit comprises of a Johnson counter corresponding to each VCO output. These counters are shown as (402A, 402B . . . 402M). Each Johnson counter divides the frequency of the VCO output by N and produces N counter outputs corresponding to each VCO output. As a result, each of the M VCO outputs are divided into N outputs, thereby making a total of 'M×N' equally spaced counter outputs. These output clock pulses have same frequency but different phases.

For a required number of counter outputs, there are numerous combinations of the number of VCO stages and the division ratio of the Johnson counter possible. These are decided by the values of M and N, where both M and N are whole numbers. The values of M and N can be chosen by the designer according to the phase accuracy required and current consumption allowed.

A basic Johnson counter has some drawbacks and hence requires certain modifications. If the initial conditions of a basic Johnson counter are set to one of the desired states, it repeats those desired states. However, if the counter reaches an undesired state, the cycle gets modified and includes some reoccurring undesired states. To overcome this problem, the Johnson counter used in the present invention is modified. Logic is added to the counter so that even if the counter reaches an invalid state, the logic drives it back to a valid state.

Since in the present invention, all counters generate a plurality of counter outputs, a specific order of all the outputs must be maintained. This is possible only if all Johnson counters start from the same state when they receive VCO output clocks. Moreover, the counter which generates the first phase of the output must receive first clock from the VCO. This is achieved by providing a sequential logic to enable the Johnson counters. The sequential logic may comprise of one or more D-type flip-flops and a combinational logic. The sequential logic uses a signal in response to which it enables the Johnson counters. This signal may be an external signal to the device which is asserted after VCO starts giving output. Another way of generating this signal is with a frequency detector.

Figure 5:
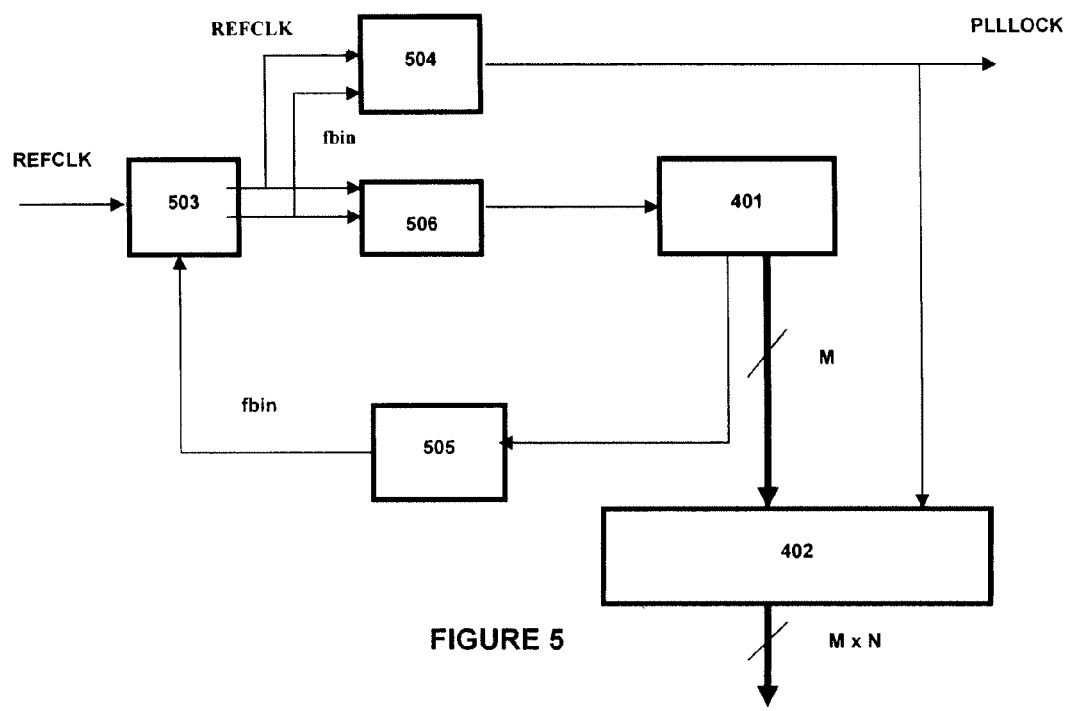
FIG. 5 shows a block diagram illustrating the structure of another embodiment of the present invention.

A multiphase clock generator which utilizes a frequency detector for generating this signal has been shown in FIG. 5. The frequency detector (503) has binary output. It compares an input clock signal REFCLK with the frequency of feedback clock (fbin). The feedback clock signal (fbin) is obtained from VCO (401) after dividing the frequency by N in divider circuit (505) as shown in the FIG. 5. Whenever, the frequency of feedback clock (fbin) is within a predefined range of input clock (REFCLK), a lock state is indicated by the lock detector (504). The lock detector (504) then generates a signal PLLLOCK which is sent to the Johnson counters. Whenever fbin frequency is not within a specified range of REFCLK freq, the detector shows 'out of lock'. The signal PLLLOCK is used for enabling the Johnson counters. Also, the signals REFCLK and fbin act as inputs to a charge pump and low pass filter (506). Charge pump and low pass filter are required for maintaining stability of the circuit. The function of a charge pump and low pass filter is to adjust the phase of clock outputs generated by VCO to match the phase of the input signal. Depending upon the deviation of VCO output clock from REFCLK, the charge pump performs charging or discharging to adjust the input level of low pass filter. The low pass filter eliminates unnecessary high frequency component included to the signal outputted from charge pump. The output of low pass filter is inputted to the VCO.

By using any of the above mentioned methods, all Johnson counters are kept in reset state till the signal is not asserted. Whenever, the signal gets asserted, reset is removed from all the counters. Reset signal is given to counters after latching it with the last clock of VCO. The first counter which receives the clock after reset removal runs with the first clock. As a result, the sequence of the output of Johnson counters is maintained.

Figure 6:
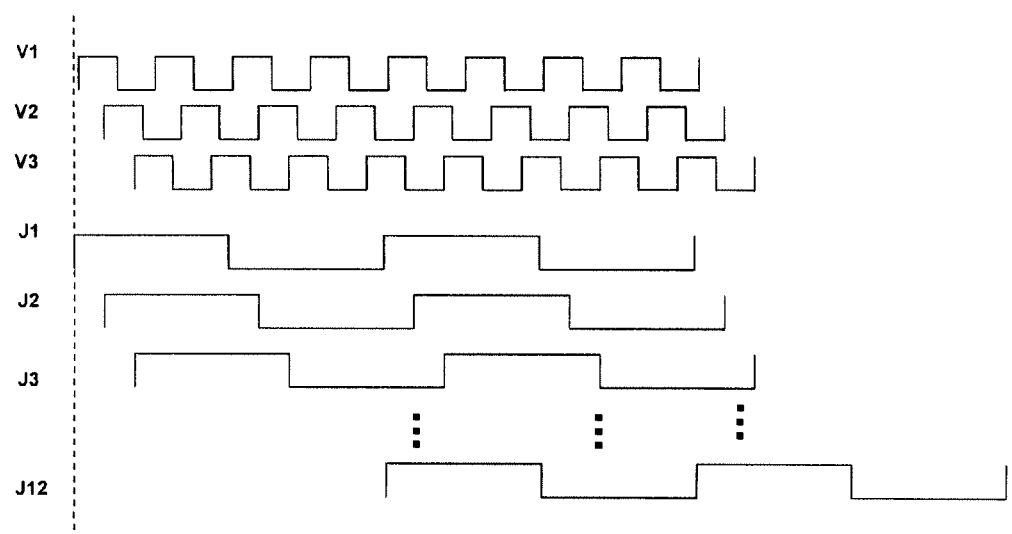
FIG. 6 shows the output clock waveforms generated by the system disclosed in the present invention.

FIG. 6 shows the output clock waveforms generated by the system disclosed in the present invention. It is assumed here that 12 phases are required at the output. This is achieved by having 3 stages in the VCO ring running at 4 times of desired frequency. This VCO generates 3 clock pulses of different phases. These are shown as V1, V2, and V3. Each of these outputs is fed to 3 "divide-by-4" Johnson counters. Each Johnson counter divides the frequency by 4 and generates a total of 12 outputs. These are shown as J1, J2 . . . J12. The outputs of the first Johnson counter correspond to J1, J4, J7, and J10. Similarly, the output of the second Johnson counter corresponds to J2, J5, J8, and J11, and the output of the third Johnson counter corresponds to J3, J6, J9, and J12.

It is to be understood that the above described configurations are only illustrative of the application of the principles of the present invention. Numerous modifications and alternative configurations may be devised by those skilled in the art without departing from the scope of the present invention, and the appended claims are intended to cover such modifications and arrangements.

We claim:

1. A circuit for generating multiple phase clock signals comprising:
   a voltage controlled oscillator (VCO) having a plurality of VCO cells cascaded in a ring structure to generate a plurality of VCO output clock signals;
   a clock divider circuit for dividing and phase shifting the VCO output clock signals, the clock divider circuit comprising a plurality of counters, one corresponding to each of the VCO output clock signals for dividing said VCO output clock signals by a specific number to generate a plurality of phase shifted output clock signals having a same frequency, such that each of said counters starts from a same state of a plurality of desired states and generates a plurality of phase shifted output clock signals in the same order in which said counters receive the VCO output clock signals; and
   a signal module for generating an external and internal signal after the VCO starts giving the output clock signals, said signal module comprising:

a frequency detector for generating said signals when a frequency of the feedback clock is within a predefined range of an input clock; and a lock detector for indicating output of a lock, when frequency of the feedback clock is not within a predefined range of the input clock and for providing an enabling signal directly to said clock divider circuit.

2. The circuit as claimed in claim 1, wherein said voltage controlled oscillator oscillates at a frequency higher than a required counter output frequency.

3. The circuit as claimed in claim 1, wherein said counter comprises a divide-by-N counter, where N is the ratio of a frequency of said voltage controlled oscillator to a required counter output frequency.

4. The circuit as claimed in claim 1, wherein said counter comprises a Johnson counter.

5. A method for generating multiple phase clock signals comprising:

generating at least one voltage controlled oscillator (VCO) output clock through a VCO;

receiving the at least one VCO output clock through a clock divider circuit;

dividing the at least one VCO output clock by a specific number to generate a plurality of phase shifted output clocks having a same frequency through at least one counter, said counter corresponding to each of the at least one VCO output clock;

generating an external and internal signal after the VCO starts giving output through a signal module;

enabling the at least one counter with an enabling signal such that said counter starts from a same state of a plurality of states and generates the plurality of phase shifted output clocks in an order in which the at least one VCO output clock is received;

generating said external and internal signal through a frequency detector, when a frequency of the feedback clock is within a predefined range of the input clock; and indicating output of a lock through a lock detector, when a frequency of the feedback clock is not within a predefined range of the input clock, said lock detector providing said enabling signal directly to said at least one counter.

6. A circuit for generating multiple phase clock signals comprising:

a multiple stage voltage controlled oscillator (VCO) including a plurality of VCO cells cascaded in a ring structure;

a clock divider circuit coupled to the multiple stage voltage controlled oscillator, the clock divider circuit including a plurality of counters directly coupled to the VCO and enabled by an enabling signal;

a frequency detector for receiving a reference clock signal coupled to said VCO; and a lock detector having an input coupled to said frequency detector and an output for providing said enabling signal directly to said clock divider circuit.

7. The circuit of claim 6 wherein the VCO is made to operate at a frequency which is N times that of a required output frequency, wherein N is an integer.

8. The circuit of claim 7 wherein the circuit generates M equally spaced VCO output clocks having different phases, wherein M is an integer.

9. The circuit of claim 8 further comprising M×N equally spaced counter outputs.

10. The circuit of claim 6 wherein each counter comprises a Johnson counter.

* * * * *